United States Patent
Russell Thomas

(10) Patent No.: US 7,154,971 B2
(45) Date of Patent: Dec. 26, 2006

(54) DTSE AT LESS THAN TWO COMPLEX SAMPLES PER SYMBOL

(75) Inventor: James Russell Thomas, Sandy Spring, MD (US)

(73) Assignee: Comsat Corporation, Bethesda, MD (US)

(*) Notice: Subject to any disclaimer, the term of this patent is extended or adjusted under 35 U.S.C. 154(b) by 758 days.

(21) Appl. No.: 10/203,347

(22) PCT Filed: Feb. 9, 2001

(86) PCT No.: PCT/US01/00690

§ 371 (c)(1),
(2), (4) Date: Feb. 6, 2003

(87) PCT Pub. No.: WO01/59980

PCT Pub. Date: Aug. 16, 2001

(65) Prior Publication Data

US 2003/0165204 A1 Sep. 4, 2003

Related U.S. Application Data

(63) Continuation-in-part of application No. 09/269,241, filed on Mar. 19, 1999, now Pat. No. 6,278,754.

(60) Provisional application No. 60/181,732, filed on Feb. 11, 2000.

(51) Int. Cl.
*H03D 1/06* (2006.01)

(52) U.S. Cl. .................................... 375/348; 375/355

(58) Field of Classification Search ................ 375/355, 375/354, 316, 340, 341; 360/46, 39, 53; 714/699, 746, 786; 348/725, 726; 329/304

See application file for complete search history.

(56) References Cited

U.S. PATENT DOCUMENTS 3,621,129 A * 11/1971 Fisher ........................ 348/26
3,878,323 A * 4/1975 Fisher ....................... 348/573
5,052,027 A 9/1991 Poklemba et al.
5,537,435 A 7/1996 Carney et al.

FOREIGN PATENT DOCUMENTS

WO  WO 98/12849 A1  3/1998

* cited by examiner

*Primary Examiner*—Chieh M. Fan
*Assistant Examiner*—Nader Bolourchi
(74) *Attorney, Agent, or Firm*—Sughrue Mion, PLLC

(57) ABSTRACT

A digitally implemented demodulator (FIG. 1) produces initial detection estimates (18O) and transition estimates (23) of symbols sampled in the range lying between 1 and 2 complex samples per symbols of the received carrier (14I), (14Q). In the case of detection estimate, the second-occurring of the two estimated values is selected as the correct value when there are two samples in the symbol interval. In the case the transition time estimate, the first-occurring of the two estimated values is selected as the correct timing estimate.

12 Claims, 7 Drawing Sheets

DTSE AT LESS THAN TWO COMPLEX SAMPLES PER SYMBOL

CLAIM OF PRIORITY

This is a National stage entry under 35 U.S.C. § 371 of Application No. PCT/US01/00690, filed Feb. 9, 2001, which claims benefit of Provisional Application No. 60/181,732, filed Feb. 11,2000, and which is a Continuation-in-part of U.S. application Ser. No. 09/269,241, filed Mar. 19, 1999, now U.S. Pat. No. 6,278,754 B1.

This application claims priority of provisional application 60/181,732 filed Feb. 11, 2000.

FIELD OF THE INVENTION

This invention relates to demodulators which operate at complex sample-per-symbol rates in the range between one and two, noninclusive, and more particularly to a Detection-Transition Sample Estimation (DTSE) demodulator.

BACKGROUND OF THE INVENTION

A need exists for high-speed modems, for example in modern broadband communication satellite systems, or their terrestrial equivalents. Another need is for very low-power modems, such as might find use in handheld communication receivers or in wireless computing devices. In addition, it is desirable to use as low a clock rate as possible relative to the symbol transmission rate in order to reduce power or so as to allow the use of a higher symbol rate with the same clock. By way of further example, clock rates at a given level of development of any given technology, such as silicon integrated circuits, gallium arsenide integrated circuits, or photonic devices, will have a finite upper frequency limit. At such a stage of development, the maximum symbol rate which can be handled by a modem will be determined, in the limit, by the number of complex samples per symbol required. Historically, the lowest practical sample per symbol rate has tended to be two complex samples per symbol. Therefore, the maximum symbol rate which a modem can handle is historically half the clock rate. In low-power applications, the symbol rate tends to be set by extrinsic standards, and therefore the clock rate is determined by the symbol rate and the number of complex samples per symbol. The power consumption is directly related to the clock rate, so a scheme which reduces the required clock rate for a given symbol rate will tend to reduce the power consumption.

Improved modems are desired.

SUMMARY OF THE INVENTION

A demodulator according to an aspect of the invention is for demodulating an analog signal representing a series of digital symbols. The analog signal may represent a series of digital bits in a binary phase-shift-keyed signal or in a quaternary-phase shift-keyed signal. The demodulator includes an analog-to-digital converter for converting the analog signal into digital form at a sample rate lying in the range between 1 and 2 complex samples per symbol, noninclusive, to thereby produce a stream of data samples. In this context, the word "noninclusive" means that the sample rate does not include the end values of the range, which is to say that the sample rate does not include 1 or 2 complex samples per symbol. The demodulator also includes a digitally implemented demodulator coupled to the analog-to-digital converter, for demodulating the stream of data samples. The digitally implemented demodulator includes (a) an initial detection sample estimator for examining temporally adjacent pairs of the stream of data samples, and for generating a provisional initial detection sample for each such temporally adjacent pair of samples. As a result of this pairing and the sample rate lying between 1 and 2 complex samples per symbol, some symbol intervals produce one such provisional initial detection sample, and some symbol intervals produce two such provisional initial detection samples. The digitally implemented demodulator also includes (b) a gating arrangement for gating only one provisional initial detection sample for each symbol, where the gating arrangement gates only the second such provisional initial detection sample occurring within symbols producing two such provisional initial detection samples. The resulting gated samples are the initial detection samples. The digitally implemented demodulator also includes (c) an intersymbol interference remover coupled to the gating arrangement of the digitally implemented demodulator, for removing at least some intersymbol interference from those provisional initial detection samples gated by the gating arrangement.

In one version, the digitally implemented demodulator further includes a transition sample estimator for examining temporally adjacent pairs of the stream of data samples, and for generating a provisional transition sample for each temporally adjacent pair of the samples. Under these circumstances, some symbol intervals produce one such provisional transition sample, and some symbol intervals produce two such provisional transition samples. This version also includes a gating arrangement for gating only one provisional transition sample for each symbol, where the gating arrangement gates only the first-occurring such provisional transition sample occurring within symbols producing two such provisional transition samples, so that the gated samples are valid transition samples.

In another view, a digitally implemented demodulator is for demodulating a stream of data samples representing a phase-shift-keyed data stream sampled at less than two and greater than one complex samples per symbol, which stream of samples has a particular sample-per-symbol rate during a given transmission. The sample-per-symbol rate may vary from time to time. The digitally implemented demodulator generates an output digital data stream, and includes an initial detection sample estimator coupled to receive the stream of data samples sampled at less than two and greater than one complex samples per symbol. The initial detection sample estimator includes (a) a first multiplier coupled to receive the stream of data samples and "right" weighting coefficients, for multiplying the right weighting coefficients by the stream of data samples, for thereby producing late product signals, (b) a first sample delay for delaying the stream of data samples by one sample interval to produce early samples, (c) a second multiplier coupled to the first sample delay for multiplying the early samples by "left" weighting coefficients to thereby produce early product signals; (d) a summing arrangement coupled to the first and second multipliers, for summing the early and late product signals for producing summed product signals, and (e) a detection gating arrangement coupled to the summing arrangement, where the detection gating arrangement includes an output port and a gating signal port, for gating to the output port of the detection gating arrangement those of the summed product signals identified by detection gating signals, and for not gating to the output port of the detection gating arrangement those of the summed product signals not identified by the detection gating signals, for thereby generating initial detection estimates.

In this other view, the digitally implemented demodulator also includes a detection sample intersymbol interference remover coupled to the output port of the detection gating arrangement, for removing from the initial detection estimates that intersymbol interference attributable to the actual sample times, relative to the symbol interval, used to produce the initial detection estimates, to thereby produce so-called soft detection output signals including provisional hard decision information. The digitally implemented demodulator further includes a transition sample estimator coupled to receive the stream of data samples. The transition sample estimator includes (a) a third multiplier coupled to receive the stream of data samples and "after" weighting coefficients, for multiplying the after weighting coefficients by the stream of data samples, for producing late product signals, (b) a second sample delay for delaying the stream of data samples by one sample interval to produce early samples, (c) a fourth multiplier coupled to the second sample delay for multiplying the early samples by a "before" weighting coefficient to thereby produce early product signals; (d) a second summing arrangement coupled to the third and fourth multipliers, for summing the early and late product signals for producing summed product signals, and (e) a transition gating arrangement coupled to the second summing arrangement. The transition gating arrangement includes an output port and a gating signal port, for gating to the output port of the transition gating arrangement those of the summed product signals identified by transition gating signals, and for not gating to the output port of the transition gating arrangement those of the summed product signals not identified by the transition gating signals. The gated summed product signals are the transition estimates. Lastly, the digitally implemented demodulator includes a control arrangement coupled to the detection and transition gating arrangements, for generating the detection and transition gating signals. The detection gating signals are generated in a manner such as to identify for gating to the output port of the detection gating arrangement only one detection estimate during each symbol interval, and in a manner such as to identify for gating to the output port of the detection gating arrangement the later-occurring of the two detection estimates occurring during those symbol intervals in which two detection estimates are generated. The control arrangement generates the transition gating signals in a manner such as to identify for gating to the output port of the transition gating arrangement only one transition estimate during each symbol interval, and so as to identify for gating to the output port of the transition gating arrangement the earlier-occurring of the two transition estimates occurring during those symbol intervals in which two transition estimates are generated.

A method according to an aspect of the invention is for generating initial estimates of detection samples. The method comprises the steps of providing left and right weighting signals, and sampling a stream of data at less than two and greater than one complex samples per symbol. As a result of this sampling rate, or whereby, at least some symbol intervals include two samples, while others include only one. The stream of data sampled at less than two complex samples per symbol is multiplied by so-called right weighting signals to produce late product signals. The stream of data is delayed by one sample interval to thereby produce early signals. The early signals are multiplied by so-called left weighting signals to produce early product signals. The early and late product signals are summed to produce summed signals. The summed signals are gated so as to pass only one summed signal per symbol interval. In a particular mode of this method, the step of gating passes only the second-occurring one of the summed signals in a symbol when two summed signals occur during a symbol interval. Ideally, the left and right weighting signals are dependent upon the sampling time of the samples within a symbol interval.

A yet further method according to another hypostasis of the invention is for generating estimates of the transition times. This method is for demodulating an analog signal representing a series of digital symbols includes the step of converting the analog signal into digital form at a sample rate lying in the range between 1 and 2 complex samples per symbol, noninclusive, to thereby produce a stream of data samples. The stream of data samples is demodulated by examining temporally adjacent pairs of the stream of data samples, and generating a provisional transition sample for each temporally adjacent pair of the samples. As a result, some symbol intervals produce one such provisional transition sample, and some symbol intervals produce two such provisional transition samples. Only the first-occurring one of the provisional transition samples are gated for each symbol producing two such provisional transition samples, so that the gated samples are transition sample estimates. In this hypostasis, the step of demodulating the stream of data samples by examining temporally adjacent pairs of the stream of data samples includes the steps of (a) multiplying the stream of data samples by a first weight to produce after weighted signals, (b) delaying the stream of data samples by a sample interval to produce before signals, (c) multiplying the before signals by a second weight to produce before weighted signals, and (d) summing the after and before weighted signals to produce the provisional transition samples.

DESCRIPTION OF THE INVENTION

Figure 1:
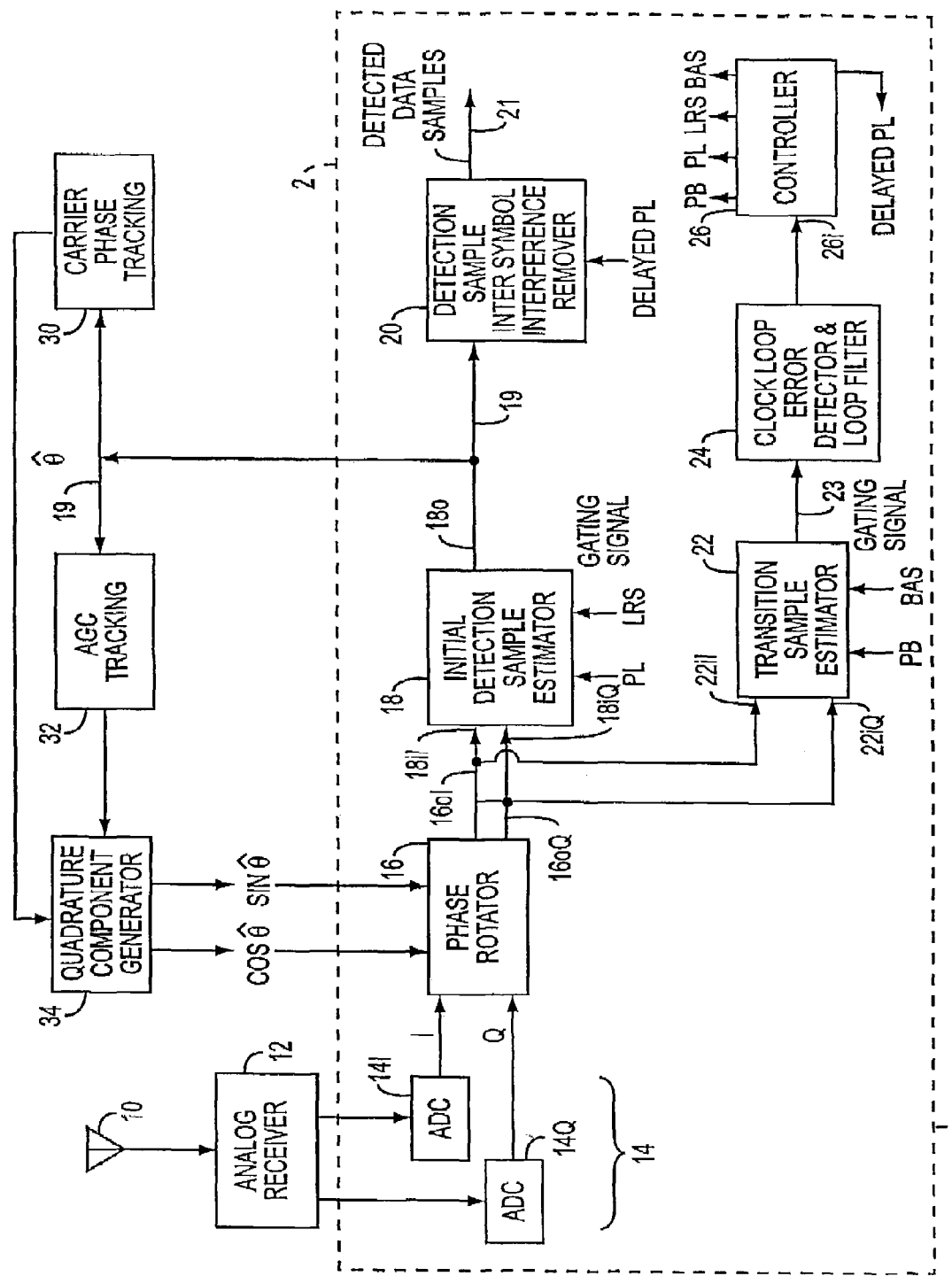
FIG. 1 is a simplified block diagram of a parallel pipeline hardware implementation or embodiment of a receiver/demodulator according to an aspect of the invention including an initial detection sample estimator, a transition sample estimator, and a controller.

In FIG. 1, an antenna 10 receives at least one BPSK or QPSK modulated carrier, and couples it to an analog receiver. The analog receiver may include such processing as low-noise amplifiers, downconverters, frequency selection filters, gain, and possibly other processing such as, for example, gain control, all as known in the art. The output signal produced by analog receiver 12 is a pair (I and Q) of modulated analog carriers at baseband, where the modulation is at some symbol rate. The baseband signals are applied to a set 14 of two analog-to-digital converters 14a and 14b of a digitally implemented demodulator 2. Digitally implemented demodulator 2 includes blocks 14a, 14b, 16, 18, 20, 22, 24, and 26. ADCs 14a and 14b sample the baseband I and Q components, respectively, applied from analog receiver 12 at a clock rate such that the samples are in the range of 1 to 2 samples per symbol of the received carrier. More specifically, the clock rate is such that there is more than one sample per symbol and less than two samples per symbol. The digital samples are applied to a phase rotator block 16 together with the estimated carrier phase. Phase rotator block 16 can be implemented as a complex multiplier, and is used to correct the phase of the I and Q samples, primarily for the static phase error attributable to the transmission path length, as well as for frequency offsets attributable to oscillator frequency offsets between the transmitter and receiver, and also, perhaps, for doppler frequency shifts. Phase rotator block 16 is identical in principle to the phase rotator described in PCT application PCT/US97/16349 filed Sep. 19, 1997 for Thomas et al., and published Mar. 26, 1998 as WO_98/12849, and is generally well known.

The phase-corrected I and Q samples from phase rotator 16 of FIG. 1 are applied over signal paths 16oI and 16oQ, respectively, to input ports 18iI and 18iQ, respectively, of initial detection sample estimator 18. The following description of the initial detection sample estimator assumes that carrier and clock synchronization have been achieved by appropriate loops, but it should be understood that the initial sample estimator will operate during initial acquisition, producing "wrong" results, which results in turn tend to drive the loops to the correct values. Initial detection sample estimator 18 receives Left-Right-Sample (LRS) gating signals and left position (PL) variables. According to an aspect of the invention, initial detection sample estimator 18 pairs (generates two-sample sets of) sequential received samples, weights the samples with weights dependent upon the PL values, and sums the weighted sample pairs, to produce an initial detection sample estimate for each symbol, in the form of a signed multibit value. The sign and the magnitude of the samples are significant because the carrier and AGC errors are derived from the value. The initial detection sample estimator 18 of FIG. 1 differs from the corresponding sample estimator described in the abovementioned Thomas et al. application, at least in that it contemplates a field-programmable gate array (FPGA) implementation. The field-programmable gate array implementation is remotely reprogrammable, and thus does not need the "case" variable described in the abovementioned application to select among various sets of weights. The initial detection sample estimator 18 of FIG. 1 also differs from that of the abovementioned application in that it includes additional multipliers and a ROM which, taken together, allow a potential estimate sample to be produced at each clock interval. The initial estimates are applied from block 18 over a path 19 to a detection sample intersymbol interference removal circuit or block 20, which may be identical to that described in the Thomas et al. application. Intersymbol interference removal block 20 tends to remove the most significant portions of intersymbol interference attributable to the initial detection sample estimation stage. Intersymbol interference removal block 20 produces I and Q "final" multibit soft decisions on a signal path 21. The multibit soft decisions include a sign bit representing the hard decision, and a complete sign and magnitude value which can be used by later stages of processing, such as forward error correction decoders, to make better decisions about what was transmitted.

The phase-corrected I and Q samples produced by phase rotator 16 of FIG. 1 at output ports 16oI and 16oQ, respectively, are also applied to input ports 22iI and 22iQ, respectively, of a transition sample estimator 22. Transition sample estimator 22 also receives before position (PB) variables and Before-After-Symbol (BAS) gating signals. In some cases, the PB weighting control signals may be equal to the PL weighting control signals. Transition sample estimator 22 pairs sample pairs, weights the samples with weights dependent upon the PB values, and sums the weighted pairs to produce a transition sample estimate for each symbol, in the form of a signed multibit value. The sign and magnitude of the samples is significant because the clock error is derived from the value. From block 22, the transition sample estimate is applied to a block 24, which represents a clock loop error detector and loop filter, which in effect differentiates the I and Q transition samples, and sums the differentiated samples to produce its output. The differentiation is controlled by the values of the I and Q estimated hard decisions, as known in the art, i.e. it is part of the general class of decision directed loops. The clock loop error detector and loop filter 24 of FIG. 1 are identical in principle to those of the abovementioned Thomas et al. application, and are well known in the art.

The output of clock loop error detector and loop filter 24 of FIG. 1 is applied to a controller illustrated as a block 26. Block 26 generates gating signals and P (sample timing position within the symbol interval) weighting control values in response to the estimated timing input from block 24. The controller can be programmed to incorporate the actual value of P which is required for the particular sample-per-symbol rate of the signals being processed. Consequently, a $_\Delta$P input to the controller block is not required, as in the arrangement of the Thomas et al. application. Of course, some input path must be provided by which the reprogramming can be accomplished, such as the configuration inputs of an FPGA. The controller 26 receives the estimated timing input at its input port 26i, sums the estimated timing value with a free-running P value to produce a corrected P value, which is then delayed to produce the PB, PL, and delayed PL signals. In addition, the corrected P value is applied to a state machine which produces the LRS and BAS gating signals.

In FIG. 1, the initial detection sample estimates are applied over signal path 19 to a carrier phase tracking block 30 and to an automatic gain control (AGC) block 32. The carrier phase tracking block 30 processes the initial detection sample estimates as known in the prior art to produce (theta hat), the estimated carrier phase. The estimated carrier phase is applied to a quadrature component generator block 34, which generates sine and cosine components of the estimated carrier phase. The AGC tracking circuit processes the initial detection sample estimates, also by means known in the art, to produce amplitude estimates, which could be applied to the analog receiver in known fashion for gain control, but which in this embodiment are applied to the quadrature component generator where the amplitude estimates are used to scale the sine and cosine components to effect a gain adjustment.

Figure 2:
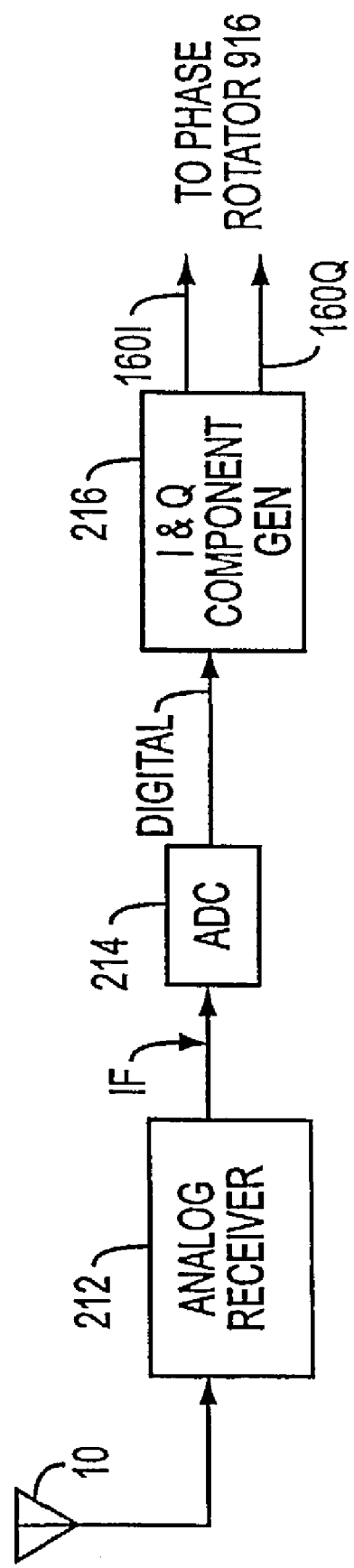
FIG. 2 is a simplified block diagram of an alternative configuration of a portion of the arrangement of FIG. 1.

FIG. 2 represents an alternative to the analog receiver 12 of FIG. 1 and ADCs 14I, 14Q. In FIG. 2, analog receiver 212 performs the same general function as receiver 12 of FIG. 1, but differs in that the output signal is produced as a modulated carrier at an intermediate frequency (IF), rather than as baseband I and Q components. In the embodiment of FIG. 2, a single analog-to-digital converter (ADC) 214 converts the IF signal to digital form. A further block 216 represents generation of the I and Q digital components from the digital IF signal. These I and Q digital components can be applied directly to phase rotator 16 of FIG. 1.

Figure 3:
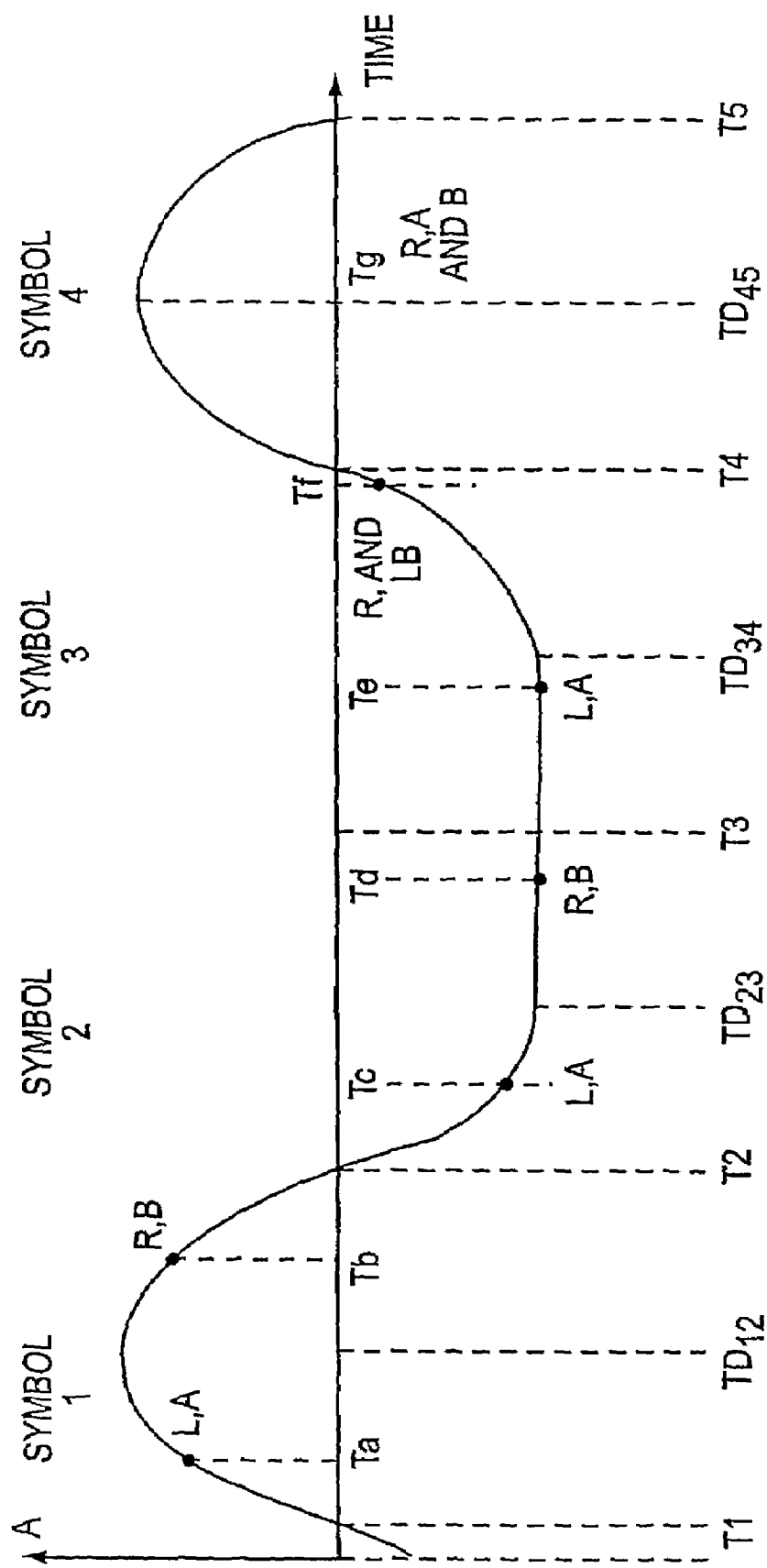
FIG. 3 illustrates a plot of signal amplitude versus time during sequential symbol intervals sampled at just under two samples per symbol.

FIG. 3 illustrates a plot 300 of signal amplitude versus time during four sequential symbol intervals T1-to-T2 (T1–T2), T2–T3, and T3–T4, denominated as symbols 1, 2, 3, and 4. The plot 300 may be conceived of as being applicable to both initial detection sampling and transition estimate sampling. Times T1, T2, T3, T4, and T5 represent the symbol transition times. The sampling rate in FIG. 3 is selected to be a trifle less than two samples per symbol, so that most symbols have two samples during their intervals, and only an occasional symbol has a single sample. In interval T1–T2 (in symbol 1) of FIG. 3, plot 300 takes on illustrative positive values, and is illustrated as being sampled at times Ta and Tb. In symbol 2 interval T2–T3, the plot takes on illustrative negative values, and sampling occurs at times designated Tc and Td, and in symbol 3 interval T3–T4, the plot also includes negative values, and sampling occurs at times Te and Tf. In symbol 5 interval T4–T5, the plot takes on positive values, and is illustrated as being sampled at time Tg. Within symbol interval T1–T2, the ideal detection time is $TD_{12}$, halfway or midway between (in temporal space or time) symbol transition times T1 and T2. Within symbol 2 interval T2–T3, the detection time is designated $TD_{23}$, and in symbol intervals T3–T4 and T4–T5, the detection times are designated $TD_{34}$ and $TD_{45}$, respectively. It will be clear that the sampling times Ta, Tb, Tc, Td, Te, and Tf do not exactly correspond with the symbol transition times T1, T2, T3, T4, and T5 , nor with the detection times $TD_{12}$, $TD_{23}$, $TD_{34}$ and $TD_{45}$. For the case of detection sampling, sampling time Ta in symbol 1 of FIG. 3 lies to the left of detection time $TD_{12}$, so is designated as a "left" (L) sample. Similarly, sampling time Tc in symbol 2 lies to the left of detection time $TD_{23}$, so is designated "L." In symbol 3, sample time Te is also designated L. Also in symbol 1, the sample occurring at time Tb lies to the right of detection time $TD_{12}$, so is designated "R." Sample Td in symbol 2, Tf in symbol 3, and Tg in symbol 4 are also designated R. Note that sample Tf is used both as a Right sample for symbol 3 and as a Left sample for symbol 4. In general, it is possible for a sample to be both B and A or L and R.

For the case of transition sampling, sampling time Tb in symbol 1 of FIG. 3 lies to the left of transition time T2, so is designated as a "before" (B) sample. Similarly, sampling time Tc in symbol 2 lies to the right of, or after, transition time T2, so is designated "A." In symbol 2, sample Td occurs before its associated transition time T3, so is labelled as "B." In symbol 3, sample time Te is after the transition time T3, so is designated A, and sample time Tf is B. Finally, by the same token as the Left and Right samples above, Tg is used as an After sample (for the symbol 3–4 transition) and as a Before sample (for the symbol 4–5 transition).

Figure 4:
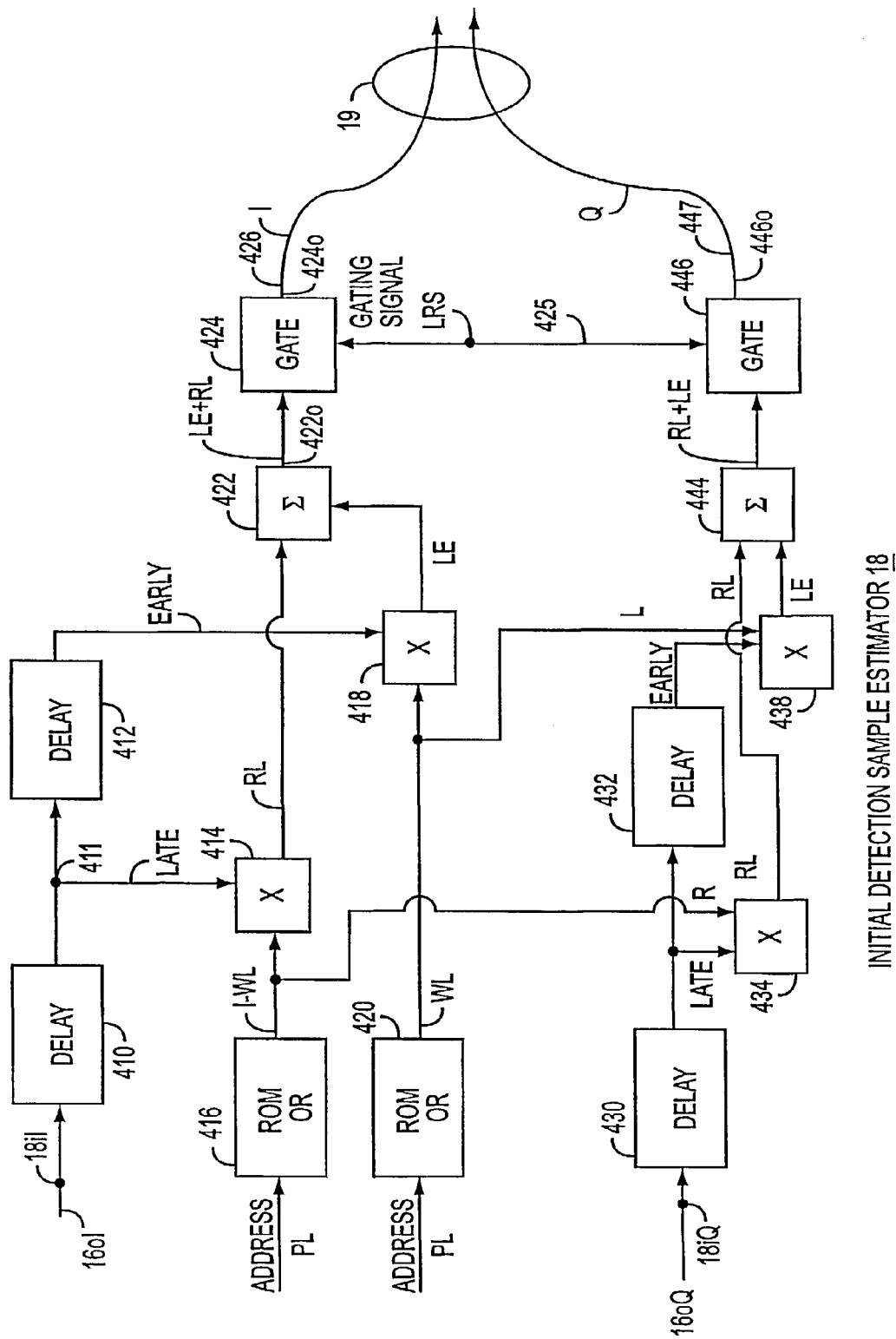
FIG. 4 is a simplified block diagram of the initial detection sample estimator of FIG. 1.

FIG. 4 is a simplified block diagram of initial detection sample estimator 18 of FIG. 1. In FIG. 4, the I digital samples from phase rotator 16 output port 16oI are applied to a delay block 410, to compensate for delays in the derivation of the P values for the lookup tables, as is conventional. The Q digital samples from phase rotator 16 output port 16oQ are applied to a delay block 430. The delayed I signals produced at the output of delay block 410 are applied over a path 411 to a further delay block 412 and to a multiplier (×) block 414. Multiplier 414 receives the signals from path 411 and multiplies the signals by "right" weights 1–wL from a read-only memory 416, which produces the weights under the control of PL address signals.

The weights are determined by the linear combination of left and right samples which maximizes the signal-to-noise ratio (SNR) as given by $$w_L s(-L) + w_r s(r) \quad\quad\quad 1$$

The output signals of multipliers 414 and 418 are temporary signals $$t_1 = I_{kL} * W_{kL} \quad\quad\quad 2$$

where W is the coefficient, $I_{kL}$ and $I_{kR}$ are the left and right detection path samples, respectively. Formulas for determination of weights W can be found in S. Sayegh, "DSP MCD for Future IBS/IDR Services," Second International Workshop on Digital Signal Processing Techniques Applied to Space Communications, 1990. It should be understood that in the context of a field-programmable gate array, the values stored in the various memory addresses of ROM 416 and other ROMs can be reprogrammed in an appropriate manner for any particular value of samples per symbol or alternative method of determining weights. The actual value of weight 1–wL produced at the output of ROM 416 is determined from sample to sample by the address PL signal applied to the ROM at the sample instant. The weight produced by ROM 416 is given by where h(*) is the impulse response of the raised cosine filter.

$$1 - w_L = \frac{h(R) - h(L)h(L+R)}{[1 - h(L-R)][h(L) + h(R)]} \quad\quad\quad 3$$

Referring to FIG. 3, the current sample exiting delay 410 of FIG. 4 may be considered to be the sample at time Tb of FIG. 3, in which case the sample exiting delay 412 of FIG. 4 must be an earlier sample, or the sample of time Ta of FIG. 3. Thus, the sample leaving delay 412 is designated as "early" and the sample leaving delay 410 is designated "late." Multiplier 414 multiplies the late signal received over signal path 411 by weight 1–wL. The output value of the weighting signal 1–wL produced by ROM 416 depends upon the predetermined values stored in the various memory locations and on the address (PL) at the time of the signal sample. Multiplier 414 thus produces a product signal which is the product of a weight multiplied by a late sample.

In FIG. 4, the delayed I signal at the output of delay block 412 is applied to a further multiplier (×) 418. Multiplier 418 also receives a weighting signal w from a ROM 420, under the control of PL signals. The left weighting signal is given by $$w_L = \frac{h(L) - h(R)h(L-R)}{[1 - h(L+R)][h(L) + h(R)]} \quad\quad\quad 4$$

As mentioned, delay 412 produces an "early" signal (relative to the signal at the output of delay block 410). Multiplier 418 multiplies the early sample from delay block 412 by the "left" weighting signal wL, and produces a temporary product signal which may be denominated "LE."

$$t_2 = I_{kR} * (1 - W_{kL}) \quad\quad\quad 5$$

The LE and RL signals from multipliers 414 and 418 are applied to a summing circuit 422, which produces the sum of the two product signals, namely LE+RL.

As illustrated in FIG. 3, there are about two samples per symbol, but the pairs of samples at Ta, Tb; Tc, ,Td; Te, Tf drift relative to the underlying symbol timing, because the number of samples per symbol is not exactly two. Consequently, in symbol 4 occupying time T4–T5, there is only one sample, namely the one at time Tg. Depending upon the exact complex-sample-per-symbol ratio in the range between greater-than-one and less-than-two, most of the symbols may contain (or be associated with) two samples, as illustrated in FIG. 3, or most of the symbols may have only one sample, with an occasional symbol having (being associated with) two samples.

The samples at the output of summing circuit 422 of FIG. 4 may be considered to be "provisional" estimates of the detection sample estimator. However, since the symbol can have only one value, it cannot be represented by two estimates. Instead, only one sample is gated through gate 424 to signal path 426 for each symbol interval. When a symbol interval includes two samples, that one of the two samples which most closely represents the "true" value of the detection estimate is chosen.

There are alternative ways to compute the weighting coefficients. For example, extensive simulation has shown that simple linear weighting produces results almost as good as the theoretically optimal weighting of equations 3 and 4. In such a linear weighting scheme, the weight is established by the distance of the sample from the detection (or transition) point normalized by $_\Delta P$, such that Left Weight=$(_\Delta P-d)/_\Delta P$; and Right Weight=$1-wL$ where "d" is the distance of the sample from the point being estimated and a symbol interval is represented by "1" (that is, normalized). In this example, $_\Delta P=1/$(# complex samples per symbol).

The sum signal LE+RL produced by summing circuit 422 of FIG. 4 may be viewed as the sum of weighted pairs of samples. As described below, the weighting is determined as a function of how close the sample is to the detection instant. Thus, if a sample happens to occur exactly at the detection instant, half-way between the transition times of FIG. 3, it is given a weight of unity or 1. As the sample approaches $_\Delta P$ away from the detection point, the weight decreases progressively, reaching a value of zero or 0 at the end point. Analysis has revealed that, when two samples occur during a symbol interval, the later-occurring of the provisional estimates of the sample is always the better choice for gating to the output port 424o of the gate 424. The gating of gate 424 is controlled by a left-right-sample (LRS) gating signal applied from a path 425.

The Q signal from output port 16oQ of phase rotator 16 of FIG. 1 is applied to delay block 430 of initial detection sample estimator 18 of FIG. 4. In general, delay 430 may be deemed to be equivalent of delay 410, and of practical importance, but not important to a theoretical understanding of the invention. The delayed signal produced by delay 430 may be deemed a "late" signal, which is applied to a further one-sample delay 432 to produce an "early" signal. Multiplier 434 multiplies the R weight from ROM 416 by the late signal to produce a RL product signal, and multiplier 438 multiplies the L weight by the early signal to produce a product LE signal. The RL and LE signals representing Q components are applied from multipliers 434 and 438 to a summing circuit 444, which sums the product signals to produce sum signal RL+LE. The RL+LE Q signal is gated to an output port 446o of a gate 446 in the same manner as that described for gate 424, under the control of the same LRS gating signal. The gated output signal on signal path 446 represents the initial detection sample estimate for Q.

Figure 5:
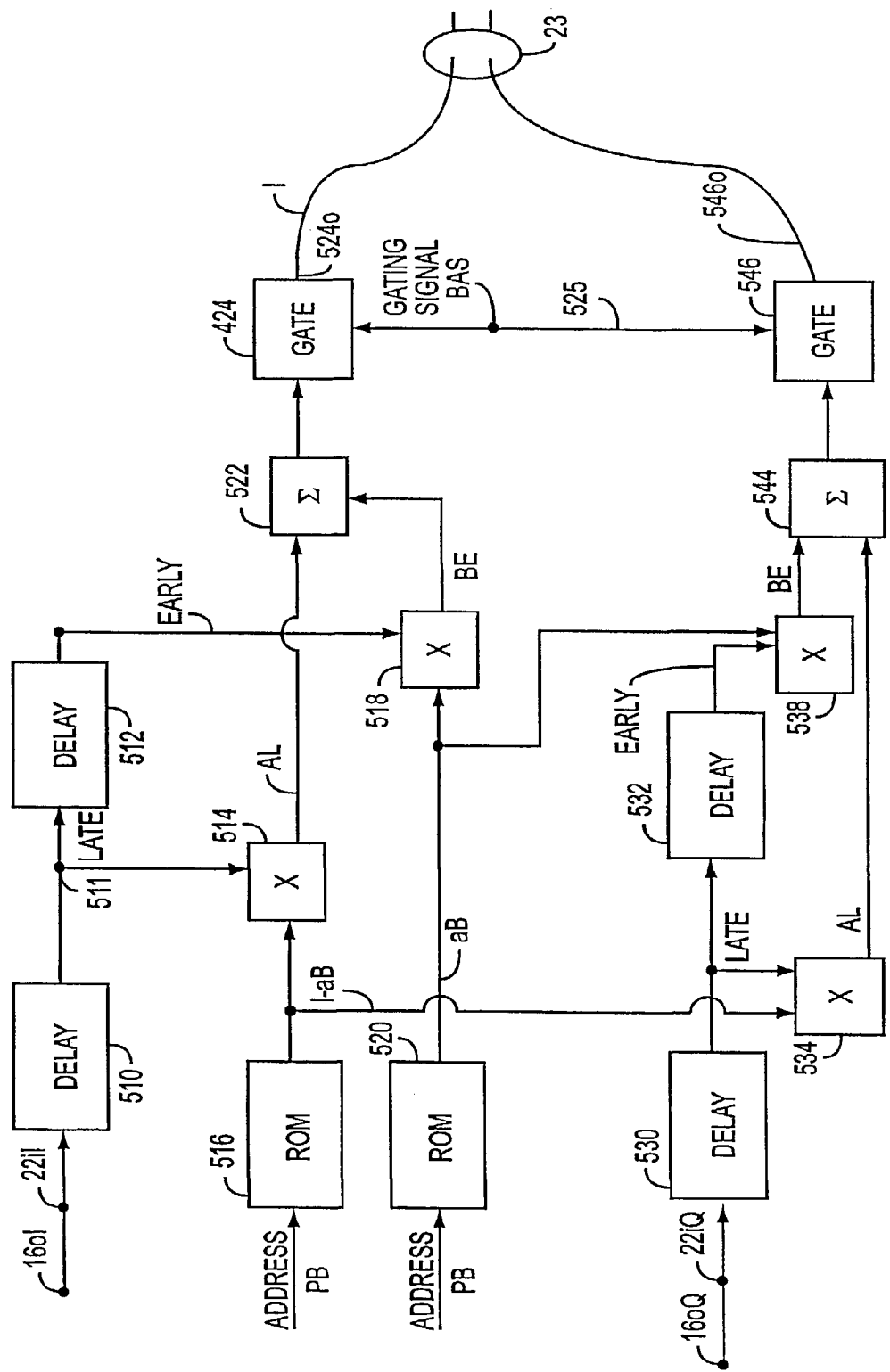
FIG. 5 is a simplified block diagram of the transition sample estimator of FIG. 1.

FIG. 5 illustrates details of transition sample estimator 22 of FIG. 1. In general, the arrangement of FIG. 5 operates much like the arrangement of FIG. 4, with the differences lying in the timing and weight values. For the transition path, analysis has shown that a simple linear weighting scheme, similar to the alternative scheme described above for the detection path, is entirely satisfactory. In order to make this correspondence between the arrangement of FIG. 5 and that of FIG. 4 more clear, elements of FIG. 5 substantially corresponding to those of FIG. 4 are designated by like reference numerals in the 500 series rather than in the 400 series. In FIG. 5, the phase corrected I signal is applied by way of input port 22iI to a synchronization delay block 510, which is not of interest in understanding the invention, and the phase corrected Q signal is applied to a corresponding delay 530. The output of delay 510 on path 511 is the late transition sample. The delayed sample on path 511 is further delayed by a delay 512 to produce the early transition sample. The late and early transition samples are applied to multipliers 514 and 516, respectively, for multiplication by weights (1–aB) and aB, respectively. The 1–aB weight is the weight applied to the late or "after" sample, and is generated by ROM 516 in response to PB address signals applied to its address input ports. The 1–aB weight is multiplied by the late or after sample to produce an AL signal at the output of multiplier 514. The aB weight is read from ROM 520 under the control of PB address signals, and is multiplied by the early or "before" sample in multiplier 518, to produce a BE sample. The AL sample from multiplier 514 and the BE sample from multiplier 518 are applied to the input ports of a summing circuit 522 Summing circuit 522 sums the two I product signals to produce a provisional I transition sample estimate which is the sum of products.

In the Q channel of the arrangement of FIG. 5, the phase corrected Q sample signals are applied to input port 22iQ of a delay 530, which needs no discussion, to produce a late sample, and the Q signal is further delayed by a delay 532 to produce an early sample. A multiplier 534 multiplies the late Q sample by the 1–aB weight from ROM 516, to produce an AL Q product sample, and a multiplier 538 multiplies the early Q sample by the aB weight, to produce a BE Q product sample. Both the AL and the BE Q sample signals are applied to a summing circuit 544 to produce a sum of the Q product signals, which is a provisional Q transition sample estimate.

The provisional I product sample signals produced by summing circuit 522 of FIG. 5 are applied to a gate 524. The provisional Q product sample signals produced by summing circuit 544 are applied to a gate 546. Gates 524 and 546 respond to Before-After-Sample (BAS) gating signals applied over a signal path 525, to gate to their output ports 524o and 546o, respectively, only one sample during each symbol interval. When only one sample occurs during a given symbol interval, it is gated to the output port of the gate, to become the I or Q transition sample estimate. When two samples occur within a symbol interval, only one is gated to the output port of the gate. Analysis has shown that the proper estimate of the transition sample is always the earlier of the two samples occurring in that symbol interval having two provisional samples. Thus, gates 524 and 546 gate to their output ports 524o and 546o, respectively, only the earlier of two provisional transition sample estimates, under the control of the BAS gating signal. The I and Q transition sample estimates are coupled onto signal path 23 for application to clock loop error detector and loop filter 24 of FIG. 1.

Figure 6:
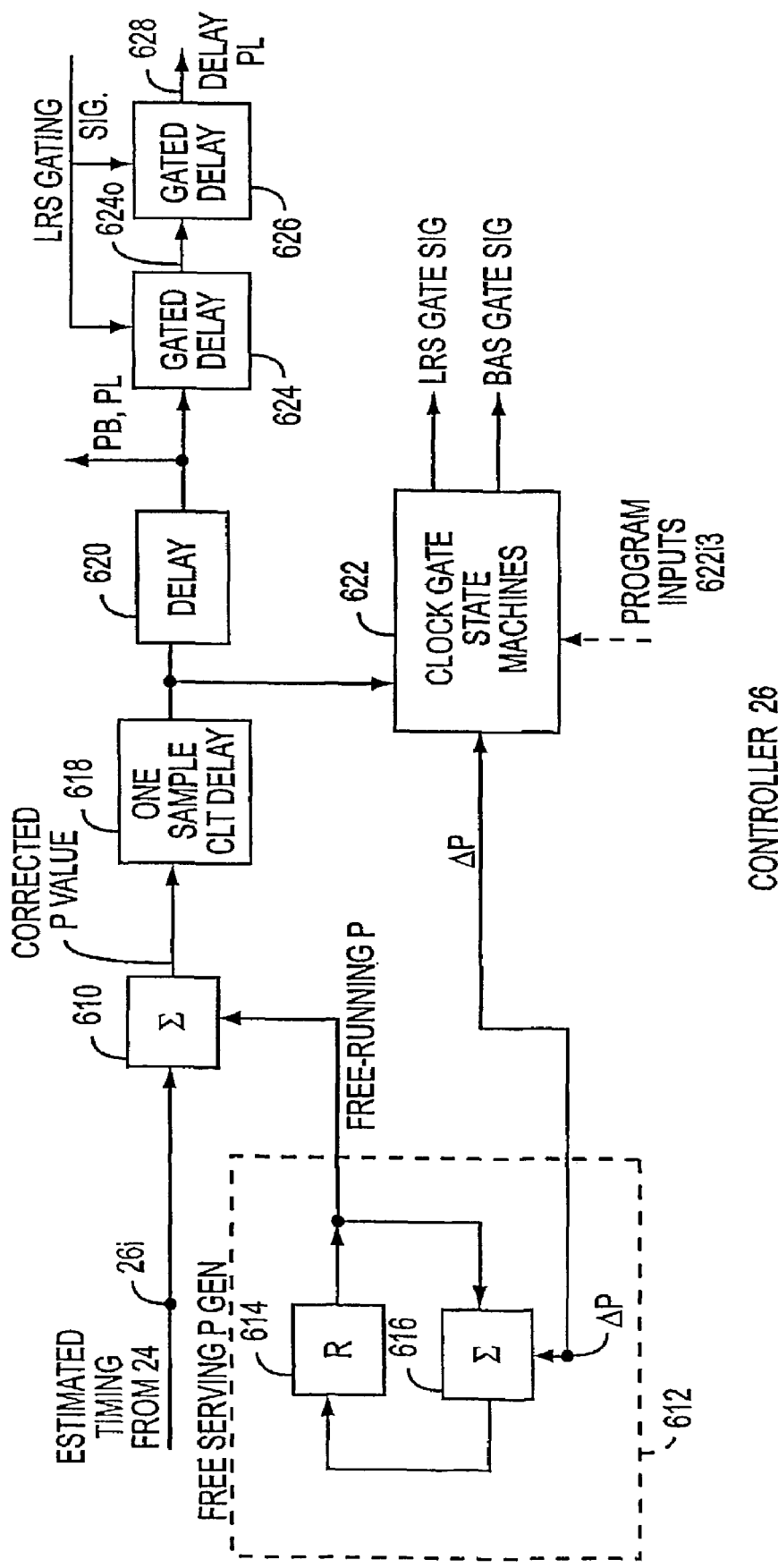
FIG. 6 is a simplified block diagram of the controller of FIG. 1.

FIG. 6 is a simplified block diagram of controller 26 of FIG. 1. In FIG. 6, the estimated timing signal from clock loop error detector and loop filter 24 of FIG. 1 is applied by way of input port 26$i$ to a first input port of a summing circuit 610. Summing circuit 610 also receives a free-running position (P) signal from a generator 612. The P signal, it will be recalled, is the sample time "position" within a symbol interval. Generator 612 is a synchronous counter which increments by $_AP$ at the clock instant for each cycle, where $_AP$ is the change in sample time from one sample to the next expressed in terms of a symbol time, as described above. Thus, the value of $_AP$ must be known a priori.

Generator 612 of FIG. 6 is a modulo counter, in that it "rolls over" at some maximum count determined by the size of a register 614. In a particular embodiment of the invention, register 614 has 14 bits, corresponding to 16,384 states; it thus rolls over at numerical count 16383. A symbol is deemed to occur during the count of 0 to 16,383, and the detection point is deemed to be the center count, namely 8192. The output of register 614 is applied to the input of a summing circuit 616, which adds to the current register count the value of $_AP$. The value of $_AP$ may be internally stored in a programmable FPGA implementation of the structure, or it may be supplied from an external source in the case of nonprogrammable embodiments. The value of 14 bits was found by experiment to be optimal in this particular embodiment.

In the arrangement of FIG. 6, the free-running P value produced by generator 612 is corrected by summing with the estimated timing signal from input port 26$i$ in summing circuit 610. Thus, the output from summing circuit 610 is the timing-corrected P value. The timing-corrected P value from summing circuit 610 of FIG. 6 is applied to a one-sample-clock delay 618. The one-sample-delayed corrected P value is applied to further one-sample delay 620 and to a clock gate state machine designated as 622. The output of delay 620 represents the PB and PL weighting control signals. The PB signals are routed to transition sample estimator 22 of FIG. 1, and the PL signal is routed to initial detection sample estimator 18 of FIG. 1. The output of delay block 620 is also applied to a gated delay block 624, which gates the signal to output port 624$o$ in response to the LRS gate signal. The gated signal from output port 624$o$ is applied to a further gated delay 626, which gates its input signal to its output signal path 628 in response to the same LRS gate signal, to produce the delayed PL signal, which is applied to detection sample intersymbol interference remover 20 of FIG. 1.

Clock gate state machine 622 of FIG. 6 receives the one-sample delayed corrected position (P) value from delay 618, and also receives the $_AP$ signal, either from generator 612, or from an internally stored value. Programming input paths 622$i$3, illustrated in phantom, may be used to program the state machine if the $_AP$ values are not internally stored. State machine 622 includes two portions, a detection state portion designated 710 and a transition state portion 750 in FIG. 7, and steps through the states set forth in FIG. 7, to generate the gating signals necessary to select the appropriate samples at each stage of processing of the system of FIG. 1. The state machine specifications are given in pseudocode as:

```
Detection Path

State DL;
        SampGate=1;
            {Samples are always enabled for less than 2 s/s}
        SymGate=1;
        if TestD gotoDRL else goto DR;
                                {which is required for s/s > 1.5}
    State DRL
        SampGate=1;
        SymGate=1;
        if TestD goto DRL else goto DR
                                {required for s/s < 1.5}
    State AR
        SampGate=1;
        SymGate=0;
        goto DL;
Transition Path State TB
        BAS gate = 1
        if TestT goto TAB else goto TA
    State TAB
        BAS gate = 1
        if TestT goto TAB else goto TA
    State TA
        BAS gate = 0
        goto TB
where:
    TestD = <is True when> (NextP >= (24576 − ₐP) ) OR
                           (NextP < (ₐP − 8192)); and
    NextP = P0 + ₐP
    TestT = <is True when> (NextP>=(16384 − ₐP) ) AND
(NextP < ₐP); and
    NextP = P0 + ₐP
```

Figure 7:
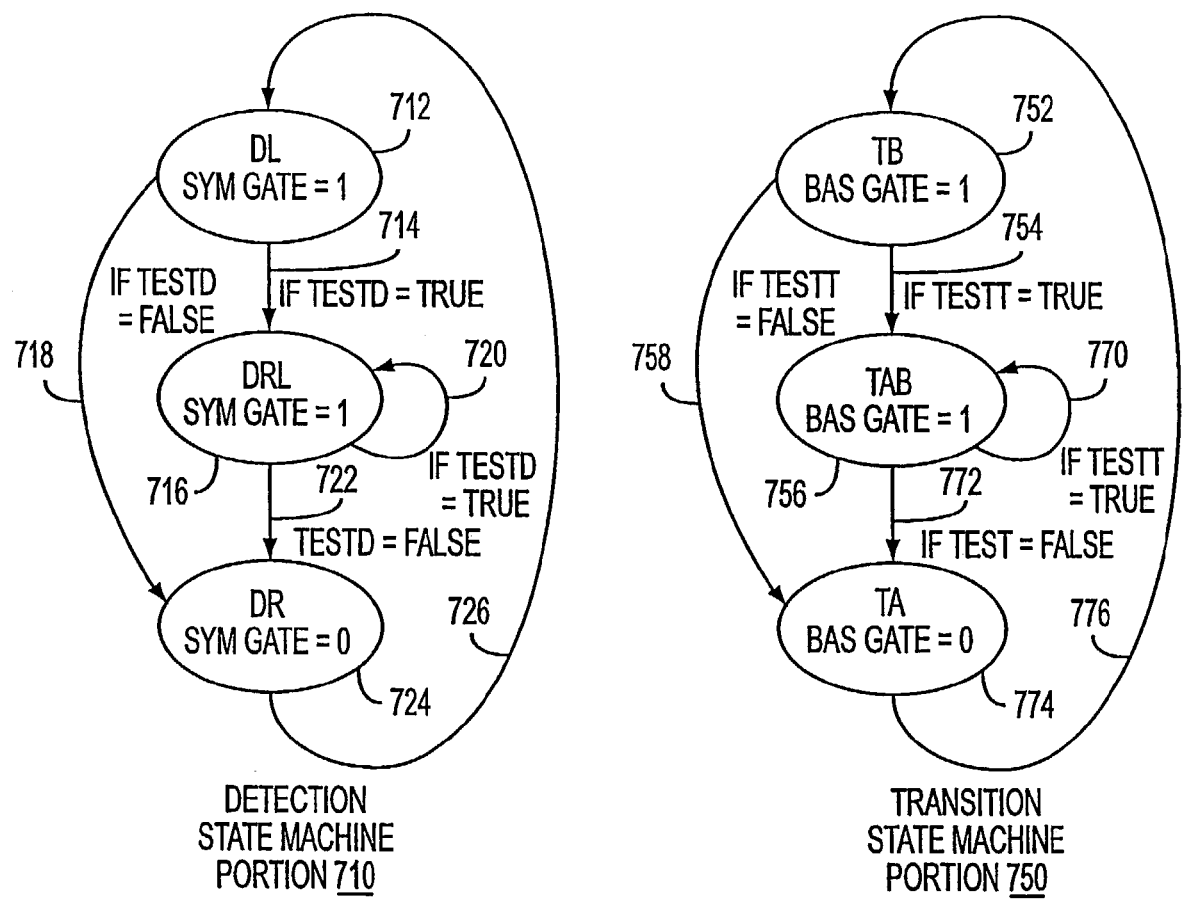
FIG. 7 is a state diagram illustrating the operation of a state machine portion of the controller of FIG. 6.

These states and state transitions are illustrated in FIG. 7, in which 712 represents the DL state, and 714 represents the "if TestD=True" path to the DRL state 716. Path 718 represents the state transition from state DL to state DR if TestD is False. State DR is designated 724. The SymGate=1 in both the DL and DRL states, State transition 720 represents the path from state DRL back to itself if TestD is True, and state transition 722 represents the trajectory if TestD is False. State DR always transitions to state DL by way of transition 726. In state DL, the SymGate=0. Similarly, state TB of FIG. 7 is represented by 752, and state transition 754 represents a transition to state TAB if TestT is true. State TAB is designated 756. The BAS gate=1 in both states TB and TAB. The transition from state TB if TestT is false is designated as 758, and leads to state TA, designated as 724. State transition 770 represents remaining in the TAB state, by means of path 770, if TestT=True, and state transition 772 leads to state TA if TestT=False. The BAS gate=0 when in state TA. State TA always transitions to state TB by way of state transition 776. The state machines may be implemented by any number of well-known methods, including state machine compilers, lookup table implementations, and custom designs.

The demodulator according the invention is particularly useful for spacecraft applications, where extremely high sample rates are required in order to sample multicarrier analog signals, and also in handheld communications receivers, where extremely low operating power is an important parameter.

Other embodiments of the invention will be apparent to those skilled in the art. For example, the entire method as described herein could be programmed into a DSP microcomputer using a single multiplier sequentially to perform the weighting function, and other equivalent features of the DSP circuit, such as memories, for lookup table storage, or direct computation of weighting factors as required, for a low-speed implementation.

Thus, a demodulator (2) according to an aspect of the invention is for demodulating an analog signal representing a series of digital symbols. The analog signal may represent a series of digital bits in a phase-shift-keyed signal or in a quaternary-phase shift-keyed signal. The demodulator (2) includes an analog-to-digital converter (14) for converting the analog signal into digital format a sample rate lying in the range between 1 and 2 complex samples per symbol, noninclusive, to thereby produce a stream of data samples. In this context, the word "noninclusive" means that the sample rate does not include the end values of the range, which is to say that the sample rate does not include 1 or 2 complex samples per symbol. The demodulator (2) also includes a digitally implemented demodulator (16, 18, 20, 22, 24, 26) coupled to the analog-to-digital converter (14), for demodulating the stream of data samples. The digitally implemented demodulator (16, 18, 20, 22, 24, 26) includes (a) an initial detection sample estimator (18) for examining temporally adjacent pairs (the sample pairs at times Ta, Tb; Tb, Tc; Tc, Td, for example) of the stream of data samples, and for generating a provisional initial detection sample (at port 422o) for each temporally adjacent pair of the samples. As a result of this pairing and the sample rate lying between 1 and 2 complex samples per symbol, some symbol intervals produce one such provisional initial detection sample, and some symbol intervals produce two such provisional initial detection samples. The digitally implemented demodulator (16, 18, 20, 22, 24, 26) also includes (b) a gating arrangement (424, 444) for gating only one provisional initial detection sample for each symbol, and the gating arrangement (424; 424, 444) gates only the second such provisional initial detection sample occurring within symbols producing two such provisional initial detection samples. The resulting gated samples (at output ports 424, 446) are components (I and/or Q) of the initial detection samples. The digitally implemented demodulator (16, 18, 20, 22, 24, 26) also includes (c) an intersymbol interference remover (20) coupled to the gating arrangement (424, 446) of the digitally implemented demodulator (16, 18, 20, 22, 24, 26), for removing at least some intersymbol interference from those provisional initial detection samples gated by the gating arrangement (424; 424, 446).

In one version, the digitally implemented demodulator (16, 18, 20, 22, 24, 26) further includes a transition sample estimator (22) for examining temporally adjacent pairs of the stream of data samples, and for generating provisional transition samples (on path 23) for each temporally adjacent pair of samples. Under these circumstances, some symbol intervals produce one such provisional transition sample, and some symbol intervals produce two such provisional transition samples. This version also includes a gating arrangement (524, 526) for gating only one (complex) provisional transition sample for each symbol, and the gating arrangement (524; 524, 546) gates only the first-occurring such provisional transition sample occurring within symbols producing two such provisional transition samples, so that the gated samples are transition samples.

In another view, a digitally implemented demodulator (16, 18, 20, 22, 24, 26) is for demodulating a stream of data samples representing a phase-shift-keyed data stream sampled at less than two and greater than one complex samples per symbol, which stream of samples has a particular sample-per-symbol rate during any given transmission. The sample-per-symbol rate may vary from time to time. The digitally implemented demodulator (16, 18, 20, 22, 24, 26) generates an output digital data stream, and includes an initial detection sample estimator (18) coupled to receive the stream of data samples sampled at less than two and more than one complex samples per symbol. The initial detection sample estimator (18) includes (a) a first multiplier (414) coupled to receive the stream of data samples and right weighting coefficients (from ROM 416), for multiplying the right weighting coefficients by the stream of data samples, for thereby producing late product signals, (b) a first sample delay (412) for delaying the stream of data samples by one sample interval to produce early detection samples, (c) a second multiplier (418) coupled to the first sample delay (412) for multiplying the early detection samples by left weighting coefficients (from ROM 420) to thereby produce early detection product signals; (d) a summing arrangement (422) coupled to the first (414) and second (418) multipliers, for summing the early and late product signals for producing summed detection product signals, and (e) a detection gating arrangement (424) coupled to the summing arrangement, where the detection gating arrangement includes an output port (424o) and a gating signal port, for gating to the output port (424o) of the detection gating arrangement (424) those of the summed detection product signals identified by detection gating signals (LRS), and for not gating to the output port (424o) of the detection gating arrangement (424) those of the summed product signals not identified by the detection gating signals (LRS), for thereby generating (on path 19) initial detection estimates. The digitally implemented demodulator (16, 18, 20, 22, 24, 26) also includes a detection sample intersymbol interference remover (20) coupled to the output port (18o) of the detection gating arrangement (18), for removing from the initial detection estimates that intersymbol interference attributable to the actual sample times, relative to the symbol interval, used to produce the initial detection estimates, to thereby produce soft detection output signals including provisional hard decision (sign) information. The digitally implemented demodulator (16, 18, 20, 22, 24, 26) further includes a transition sample estimator (22) coupled to receive the stream of data samples. The transition sample estimator (22) includes (a) a third (514) multiplier coupled to receive the stream of data samples together with after weighting coefficients (from ROM 516), for multiplying the after weighting coefficients by the stream of data samples, for producing late product signals, (b) a second sample delay (512) for delaying the stream of data samples by one sample interval to produce early samples, (c) a fourth multiplier (518) coupled to the second sample delay (512) for multiplying the early transition samples by a before weighting coefficient to thereby produce early product signals; (d) a second summing arrangement (522) coupled to the third (514) and fourth (518) multipliers, for summing the early and late product signals for producing summed product signals, and (e) a transition gating arrangement (524) coupled to the second summing arrangement (522). The transition gating arrangement (524) includes an output port (524o) and a gating signal port, for gating to the output port (524o) of the transition gating arrangement (524) those of the summed product signals identified by transition gating signals (BAS), and for not gating to the output port (524o) of the transition gating arrangement (524) those of the summed product signals not identified by the transition gating signals (BAS). The gated summed transition product signals are the transition estimates. Lastly, the digitally implemented demodulator (16, 18, 20, 22, 24, 26) includes a control arrangement (26) coupled to the detection (424; 424, 446) and transition (534; 534, 546) gating arrangements, for generating the detection (LRS) and transition (BAS) gating signals. The detection gating signals (LRS) are generated in a manner such as to identify for gating to the output port of the detection gating arrangement only one provisional detection estimate during each symbol interval, and in a manner such as to identify for gating to the output port of the detection gating arrangement the later-occurring of the two provisional detection estimates occurring during those symbol intervals in which two provisional detection estimates are generated. The control arrangement generates the transition gating signals (BAS) in a manner such as to identify for gating to the output port of the transition gating arrangement only one provisional transition estimate during each symbol interval, and so as to identify for gating to the output port of the transition gating arrangement the earlier-occurring of the two provisional transition estimates occurring during those symbol intervals in which two provisional transition estimates are generated.

A method according to an aspect of the invention is for generating initial estimates of detection samples. The method comprises the steps of providing left and right weighting signals (from ROMS 416 and 420), and sampling (ADC 14I; 14I, 14Q) a stream of data at less than two and greater than one complex samples per symbol. As a result of this sampling rate, or whereby, at least some symbol intervals include two samples. The stream of data sampled at less than two and greater than one complex samples per symbol is multiplied (414) by the right weighting signals to produce late product signals. The stream of data is delayed (412) by one sample interval to thereby produce early signals. The early signals are multiplied (418) by the left weighting signals to produce early product signals. The early and late product signals are summed (422) to produce summed signals. The summed signals are gated (26, 424) so as to pass only one summed signal per symbol interval. In a particular mode of this method, the step of gating passes only the second-occurring one of the summed signals in a symbol when two summed signal samples occur during a symbol interval. Ideally, the left and right weighting signals are dependent upon the sampling time within a symbol interval.

What is claimed is:

1. A demodulator for demodulating an analog signal representing a series of digital symbols, said demodulator comprising:

an analog-to-digital converter for converting said analog signal into digital form at a sample rate lying in the range between 1 and 2 complex samples per symbol, noninclusive, to thereby produce a stream of data samples;

a digitally implemented demodulator coupled to said analog-to-digital converter, for demodulating said stream of data samples, said digitally implemented demodulator including (a) an initial detection sample estimator for examining temporally adjacent pairs of said stream of data samples, and for generating a provisional initial detection sample for each temporally adjacent pair of said samples, whereby some symbol intervals produce one such provisional initial detection sample, and some symbol intervals produce two such provisional initial detection samples, said digitally implemented demodulator also including (b) gating means for gating only one provisional initial detection sample for each symbol, and said gating means gates only the second such provisional initial detection sample occurring within symbols producing two such provisional initial detection samples, so that the gated samples are initial detection samples; and an intersymbol interference remover coupled to said gating means of said digitally implemented demodulator, for removing at least some intersymbol interference from those provisional initial detection samples gated by said gating means.

2. A demodulator according to claim 1, wherein said analog signal representing a series of digital bits is a phase-shift-keyed signal.

3. A demodulator according to claim 1, wherein said analog signal representing a series of digital bits is a quaternary-phase shift-keyed signal.

4. A demodulator according to claim 3, wherein said digitally implemented demodulator further comprises:

a transition sample estimator for examining temporally adjacent pairs of said stream of data samples, and for generating a provisional transition sample for each temporally adjacent pair of said samples, whereby some symbol intervals produce one such provisional transition sample, and some symbol intervals produce two such provisional transition samples; and gating means for gating only one provisional transition sample for each symbol, and said gating means gates only the first-occurring such provisional transition sample occurring within symbols producing two such provisional transition samples, so that the gated samples are transition samples.

5. A digitally implemented demodulator for demodulating a stream of data samples sampled at less than two and greater than one complex samples per symbol, said stream of data samples representing a phase-shift-keyed data stream, having a particular sample per symbol rate at any given moment, which sample per symbol rate may vary from time to time, said digitally implemented demodulator being for generating an output digital data stream, said digitally implemented demodulator comprising:

an initial detection sample estimator coupled to receive said stream of data samples sampled at less than two and greater than one complex samples per symbol, said initial detection sample estimator including (a) a first multiplier coupled to receive said stream of data samples and right weighting coefficients, for multiplying said right weighting coefficients by said stream of data samples, for thereby producing late initial detection product signals, (b) a first sample delay coupled to receive said stream of data samples, for delaying said stream of data samples by one sample interval to produce early samples, (c) a second multiplier coupled to receive left weighting coefficients, and also coupled to said first sample delay, for multiplying said early samples by said left weighting coefficients to thereby produce early initial detection product signals; (d) summing means coupled to said first and second multipliers, for summing said early and late initial detection product signals for producing summed initial detection product signals, and (e) detection gating means coupled to said summing means, said detection gating means including an output port and a gating signal port, for gating to said output port of said detection gating means those of said summed initial detection product signals identified by a detection gating signal, and for not gating to said output port of said detection gating means those of said summed initial detection product signals not identified by said detection gating signal, for thereby generating initial detection estimates;

a detection sample intersymbol interference remover coupled to said output port of said detection gating means, for removing from said initial detection estimates that intersymbol interference attributable to the actual sample times, relative to the symbol interval, used to produce said initial detection estimates, to thereby produce soil decision output signals including provisional hard decision information;

a transition sample estimator coupled to receive said stream of data samples, said transition sample estimator including (a) a third multiplier coupled to receive said stream of data samples and after weighting coefficients, for multiplying said after weighting coefficients by said stream of data samples, for producing late transition product signals, (b) a second sample delay for delaying said stream of data samples by one sample interval to produce early samples, (c) a fourth multiplier coupled to receive before weighting coefficients, and also coupled to said second sample delay, for multiplying said early samples by said before weighting coefficients to thereby produce early transition product signals; (d) second summing means coupled to said third and fourth multipliers, for summing said early and late transition product signals for producing summed transition product signals, and (e) transition gating means coupled to said second summing means, said transition gating means including an output port and a gating signal port, for gating to said output port of said transition gating means those of said summed transition product signals identified by a transition gating signal, and for not gating to said output port of said transition gating means those of said summed transition product signals not identified by said transition gating signal, for generating initial transition estimates; and control means coupled to said detection and transition gating means, for generating said detection and transition gating signals, said detection gating signals being generated in a manner such as to identify for gating to the output port of said detection gating means only one detection estimate during each symbol interval, and in a manner such as to identify for gating to said output port of said detection gating means the later of the two detection estimates occurring during those symbol intervals in which two detection estimates are generated, said control means generating said transition gating signals in a manner such as to identify for gating to said output port of said transition gating means only one transition estimate during each symbol interval, and in a manner such as to identify for gating to said output port of said transition gating means the earlier of the two transition estimates occurring during those symbol intervals in which two transition estimates are generated.

6. A method for generating initial estimates of a detection sample, said method comprising the steps of:
   providing left and right weighting signals;
   sampling a stream of data at less than two and greater than one complex samples per symbol, whereby at least some symbol intervals include two samples;
   multiplying said stream of data sampled at less than two and greater than one complex samples per symbol by said right weighting signals to produce a late product signal;
   delaying said stream of data by one sample interval to thereby produce an early signal;
   multiplying said early signal by said left weighting signals to produce an early product signal;
   summing said early and late product signals to produce summed signals; and
   gating said summed signals so as to pass only one summed signal per symbol interval.

7. A method according to claim 6, wherein said step of gating passes only the second-occurring one of said summed signals in a symbol when two summed signal samples occur during a symbol interval.

8. A method according to claim 6, wherein said left and right weighting signals are dependent upon the sampling time within a symbol interval.

9. A method for demodulating an analog signal representing a series of digital symbols, said method comprising the steps of:
   converting said analog signal into digital form at a sample rate lying-in the range between 1 and 2 complex samples per symbol, noninclusive, to thereby produce a stream of data samples;
   demodulating said stream of data samples by examining temporally adjacent pairs of said stream of data samples, for generating a provisional transition sample for each temporally adjacent pair of said samples, whereby some symbol intervals produce one such provisional transition sample, and some symbol intervals produce two such provisional transition samples; and
   gating only the first-occurring one of said provisional transition samples for each symbol producing two such provisional transition samples, so that the gated samples are transition sample estimates.

10. A method according to claim 9, wherein said step of demodulating said stream of data samples by examining temporally adjacent pairs of said stream of data samples comprises the steps of:
    multiplying said stream of data samples by a first weight to produce after weighted signals;
    delaying said stream of data samples by a sample interval to produce before signals;
    multiplying said before signals by a second weight to produce before weighted signals; and
    summing said after and before weighted signals to produce said provisional transition samples.

11. A method for demodulating an analog signal representing a series of digital symbols, said method comprising the steps of:
    converting said analog signal into digital form at a sample rate lying in the range between 1 and 2 complex samples per symbol, noninclusive, to thereby produce a stream of data samples;
    demodulating said stream of data samples by examining temporally adjacent pairs of said stream of data samples, for generating a provisional detection estimate for each temporally adjacent pair of said samples, whereby some symbol intervals produce one such provisional detection estimate, and some symbol intervals produce two such provisional detection estimates; and
    gating only the second-occurring one of said provisional detection estimates for each symbol producing two such provisional detection estimates, so that the gated samples are detection estimates.

12. A method according to claim 11, wherein said step of examining temporally adjacent pairs of said stream of data samples comprises the further steps of:
    multiplying said stream of data samples by a first weight to produce late weighted signals;
    delaying said stream of data samples by one sample interval to produce early samples;
    multiplying said early samples by a second weight, to produce early weighted samples; and
    summing together said early and late weighted samples to produce said provisional detection samples.

* * * * *